(12) United States Patent
Noguchi et al.

(10) Patent No.: US 7,042,090 B2
(45) Date of Patent: May 9, 2006

(54) ELECTRONIC DEVICE AND METHOD OF FABRICATING THE SAME

(75) Inventors: Takao Noguchi, Tokyo (JP); Hisatoshi Saito, Tokyo (JP)

(73) Assignee: TDK Corporation, (JP)

( * ) Notice: Subject to any disclaimer, the term of this patent is extended or adjusted under 35 U.S.C. 154(b) by 158 days.

(21) Appl. No.: 10/786,776

(22) Filed: Feb. 24, 2004

(65) Prior Publication Data

US 2005/0093157 A1 May 5, 2005

(30) Foreign Application Priority Data

Oct. 30, 2003 (JP) .............................. 2003-369837

(51) Int. Cl.
*H01L 23/48* (2006.01)

(52) U.S. Cl. ........................................ 257/753; 257/783

(58) Field of Classification Search .................. 257/753, 257/783; 438/418, 419

See application file for complete search history.

(56) References Cited

U.S. PATENT DOCUMENTS

| 6,045,626 | A | 4/2000 | Yano et al. | |
|---|---|---|---|---|
| 6,258,459 | B1 | 7/2001 | Noguchi et al. | |
| 2003/0121697 | A1* | 7/2003 | Nagai et al. ................. | 174/259 |
| 2004/0069649 | A1* | 4/2004 | Katayama et al. ........... | 205/125 |
| 2005/0224978 | A1* | 10/2005 | Kawate et al. ............... | 257/753 |

FOREIGN PATENT DOCUMENTS

| JP | 11260835 | 9/1999 |
|---|---|---|
| JP | 11-312801 | 11/1999 |

* cited by examiner

*Primary Examiner*—Tuan H. Nguyen
(74) *Attorney, Agent, or Firm*—Young Law Firm, P.C.

(57) ABSTRACT

An electronic device includes a substrate, a lower conductive film formed on the substrate and a functional film formed on the lower conductive film. In the present invention, an adhesion of the lower conductive film on the side of the substrate is greater than or equal to 0.1 N/cm. The electronic device according to this invention exhibits high mechanical strength that makes it very reliable. This is because the invention prevents the physical exfoliation of the lower conductive film that is apt to occur during or after fabrication of the electronic device when the adhesion of the lower conductive film is lower than 0.1 N/cm.

20 Claims, 6 Drawing Sheets

ELECTRONIC DEVICE AND METHOD OF FABRICATING THE SAME

TECHNICAL FIELD

The present invention relates to an electronic device and a method of fabricating the electronic device, particularly to an electronic device including a ferroelectric or piezoelectric functional film and an electrically conductive film provided in the vicinity thereof used to a film capacitor, ferroelectric nonvolatile memory, film bulk acoustic wave resonator or the like, and to a method of fabricating the same.

BACKGROUND OF THE INVENTION

Functional films composed of ferroelectric material or piezoelectric material are used in some electronic devices such as film capacitors, ferroelectric nonvolatile memories, film bulk acoustic wave resonators and the like. A film bulk acoustic wave resonator, for instance, is configured by sandwiching a functional film made of a piezoelectric material between an upper conductive film and a lower conductive film. The film bulk acoustic wave resonator operates as a high-frequency filter when a high-frequency signal is applied across the two conductors.

In order to achieve good device characteristics in such an electronic device, it is necessary to enhance the crystallinity of the functional film. In order to enhance it, it is important not only to optimize the functional film-forming method and conditions but also to improve the crystallinity of the lower conductive film serving as the base for the functional film. This is because the crystallinity of the lower conductive film serving as the base markedly affects the crystallinity of the functional film. A method of forming a lower conductive film with good crystallinity is taught by, for example, Japanese Patent Application Laid Open No. 11-312801.

The material of the lower conductive film needs to be one having high lattice matching and low reactivity with respect to the functional film formed thereon. When, for example, ZnO or some other such piezoelectric material of wurtzite crystal structure is used as the functional film material, therefore, the lower conductive film serving as the base is preferably a (111)-oriented film of a metal that assumes a face-centered cubic crystal structure, such as platinum (Pt), gold (Au), iridium (Ir) or rhodium (Rh).

However, the adhesion between the lower conductive film and the next layer thereunder serving as its base differs depending on the method and temperature used to form the lower conductive film. In some cases, only very weak adhesion can be obtained. In particular, the adhesion between a (111)-oriented film of a metal like platinum (Pt) that assumes a face-centered cubic crystal structure and the underlying insulator base markedly changes with the fabrication conditions. As a result, the lower conductive film may experience physical peeling that greatly degrades the reliability of the electronic device as a product. Moreover, when the fabricated electronic device is a film bulk acoustic wave resonator, slight exfoliation occurring at the interface between the lower conductive film and its base may markedly degrade the device characteristics. The lower conductive film is therefore required to have excellent adhesion.

SUMMARY OF THE INVENTION

It is therefore an object of the present invention to provide an electronic device whose lower conductive film is excellent in both crystallinity and adhesion.

Another object of the present invention is to provide a method of fabricating the electronic device whose lower conductive film is excellent in both crystallinity and adhesion.

The electronic device according to the present invention comprises a substrate, a lower conductive film formed on the substrate and a functional film formed on the lower conductive film, wherein adhesion of the lower conductive film on a side of the substrate is greater than or equal to 0.1 N/cm.

The electronic device according to this invention exhibits high mechanical strength that makes it very reliable. This is because the invention prevents the physical exfoliation of the lower conductive film that is apt to occur during or after fabrication of the electronic device when the adhesion of the lower conductive film is lower than 0.1 N/cm. Moreover, in the case where the electronic device is fabricated as a film bulk acoustic wave resonator, the adhesion of 0.1 N/cm or higher exhibited by the lower conductive film enables effective suppression of the pronounced degradation of the device characteristics caused by slight exfoliation occurring at the interface between the lower conductive film and its base.

In a preferred aspect of the present invention, the adhesion is greater than or equal to 1 N/cm. According to this aspect of the present invention, the probability of physical peeling of the lower conductive film becomes extremely low, so that no degradation of characteristics resulting from insufficient lower conductive film adhesion arises even when the fabricated electronic device is used as a film bulk acoustic wave resonator.

In a further preferred aspect of the present invention, the lower conductive film is a metallic film oriented in a (111) plane of a face-centered cubic structure or a (0001) plane of a hexagonal close-packed structure and the functional film is made of a piezoelectric material having a wurtzite crystal structure. The resulting enhancement of functional film crystallinity by lattice matching makes it possible to achieve excellent device characteristics.

In a further preferred aspect of the present invention, an adhesion orientation control film is further provided between the substrate and the lower conductive film. In this case, the adhesion orientation control film is preferably made of a crystal having a wurtzite structure and is preferably a (0001)-oriented film whose (0001) plane is oriented parallel to the surface of the substrate. The material thereof is preferably AlN. When such an adhesion orientation control film is used, the crystallinity of the functional film is further enhanced while also achieving an additional improvement in the adhesion of the lower conductive film on the side of the substrate.

The X-ray rocking curve full with at half maximum (FWHM) of the lower conductive film and functional film are preferable not greater than 5 degrees and more preferably not greater than 3 degrees. Since the crystallinity of the lower conductive film is reflected in the crystallinity of the functional film, X-ray rocking curve FWHM of the functional film can be made not greater than 5 degrees or not greater than 3 degrees by defining the lower conductive film X-ray rocking curve FWHM as not greater than 5 degrees or not greater than 3 degrees. When the X-ray rocking curve FWHM of the functional film is not greater than 5 degrees, relatively good device characteristics can be achieved. When it is not greater than 3 degrees, very good device characteristics can be achieved.

An upper conductive film is preferably further provided on the functional film to configure a film bulk acoustic wave resonator composed of the lower conductive film, functional film and upper conductive film. This is because excellent device characteristics can also be obtained when the electronic device is used as a film bulk acoustic wave resonator since the high adhesion of the lower conductive film of the present invention ensures that substantially no minute exfoliation occurs at the interface between the lower conductive film and its base. When the electronic device of this invention is used as a film bulk acoustic wave resonator, an acoustic multilayer is preferably included in the substrate at its surface. Such provision of the acoustic multilayer improves the characteristics of the film bulk acoustic wave resonator by efficiently reflecting vibration propagated in the direction of the substrate body.

The method of fabricating an electronic device according to this invention comprises a step of forming a lower conductive film having adhesion of not lower than 0.1 N/cm on a substrate and a step of forming a functional film on the lower conductive film. The method preferably further comprises a step of forming an adhesion orientation control film on the substrate before forming the lower conductive film on the substrate.

Thus, by ensuring high mechanical strength of the electronic device, the present invention markedly enhances product reliability. Moreover, when the lower conductive film is formed as a metallic film oriented in the (111) plane of a face-centered cubic structure or the (0001) plane of a hexagonal close-packed structure and the functional film is composed of a piezoelectric material having a wurtzite crystal structure, the resulting enhancement of the functional film crystallinity makes it possible to obtain good device characteristics.

The electronic device according to this invention is therefore particularly suitable for use as a film bulk acoustic wave resonator.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
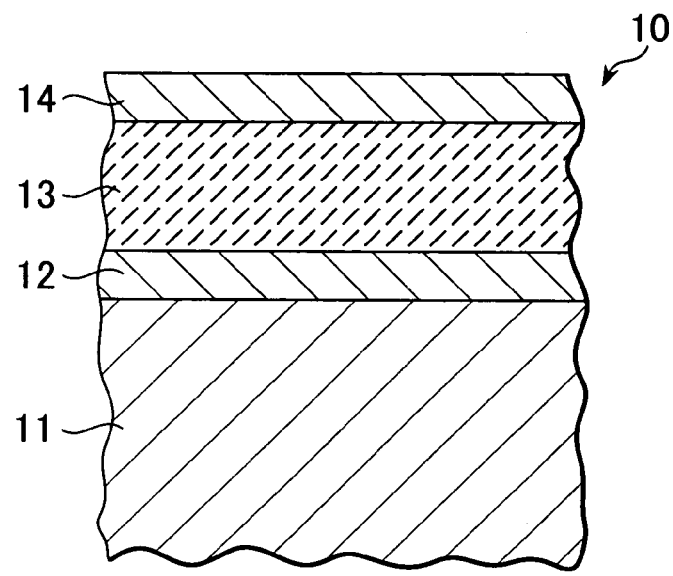
FIG. 1 is a simplified sectional view showing the structure of an electronic device that is a preferred embodiment of the present invention.

FIG. 1 is a simplified sectional view showing the structure of an electronic device 10 that is a preferred embodiment of the present invention.

As shown in FIG. 1, the electronic device 10 of this embodiment includes a substrate 11, a lower conductive film 12 formed on the substrate 11, a functional film 13 formed on the lower conductive film 12, and an upper conductive film 14 formed on the functional film 13. The electronic device 10 of this embodiment thus has a structure in which the functional film 13 is sandwiched between the lower conductive film 12 and the upper conductive film 14. Therefore, if a piezoelectric material such as ZnO is used as the material of the functional film 13, the electronic device 10 can be used as a film bulk acoustic wave resonator, ink-jet printer head or the like, while if a ferroelectric material such as PZT is used as the functional film 13, it can be used as a ferroelectric nonvolatile memory, film capacitor or the like. Moreover, by combining such an electronic device 10 with other circuitry, it becomes possible to configure various electronic devices such high-frequency filters, duplexers, and integrated semiconductor circuits with built-in RF section for telecommunication applications.

In the electronic device of this invention, the adhesion of the lower conductive film 12 on the side of the substrate 11 is not less than 0.1 N/cm and preferably not less than the 1.18 N/cm specified by JIS Z 1522 as the adhesive force of adhesive tape. Or, otherwise, adhesion around a level that prevents peeling in a tape test is preferable. No upper limit is defined for the adhesion. Greater adhesion improves the mechanical strength of the device and enables fabrication of an electronic device excellent in reliability. Adhesion can be expressed not only by adhesion energy but also by the load or force per unit area required to peel off the film. The adhesion expressed in terms of load is preferably not less than 10 N, and the adhesion expressed in terms of force per unit area is preferably not less than 1 GPa.

The adhesion can be assessed using a tape test, peel test, topping test, scratch test, indentation test or other such adhesion test. Among these, the tape test and peel test are most preferable because they enable easy assessment and measurement of adhesion. When measuring the electronic device of the present invention for adhesion, it is best to use the peel test. Specifically, measurement is conducted in the peel test by first adhering cellophane tape, Kapton tape or other such adhesive tape to the surface of the film attached to the substrate 11 and then slowly peeling of the film vertically while measuring the applied peeling force with a spring scale or the like. The measured force is divided by the tape width to obtain the adhesion per unit width. The adhesion per unit width is equivalent to the adhesion energy between the film and its base at the peeled interface. The term "adhesion" as used in this patent specification and claims means the adhesion energy measured in this manner.

The constituent elements of the electronic device 10 will now be explained in detail.

Substrate 11

As the substrate 11 can be used, for example, a single crystal substrate of silicon (Si), sapphire or the like, a ceramic substrate of alumina, AlTiC or the like, or a quartz or glass substrate. The material of the substrate 11 can be suitably selected taking into account the processes to be used, the desired characteristics of the device, cost and other considerations. For example, when silicon (Si) or glass is used as the material of the substrate 11, an electronic device substrate of low cost can be obtained, while when a high-temperature process conducted at a temperature exceeding 600° C. is required, silicon (Si) or quartz is preferably used. The most preferable material for the substrate 11 is Si single crystal, which is advantageous from the points of low cost and the availability of sophisticated wafer processes.

It is possible to use as the substrate 11 one whose surface has been pre-formed with some kind of film or been subjected to polishing or other such mechanical processing. Most industrial purpose substrates, especially those made of silicon (Si), have been subjected to polishing or other mechanical processing before marketing. On the other hand, some ceramic substrates are pre-formed with a surface film, which itself may be polished, in order to reduce surface roughness. All such substrates are usable in the present invention.

Figure 2:
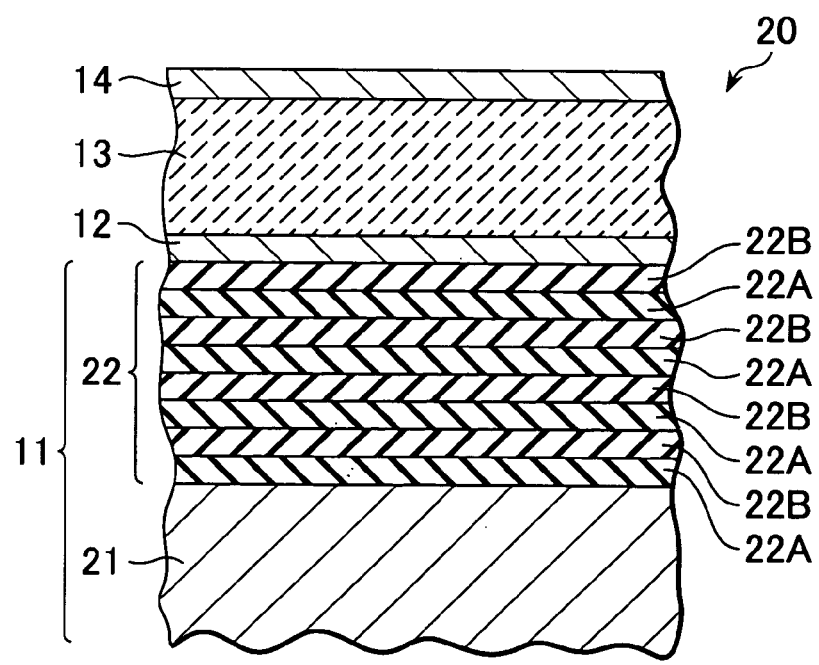
FIG. 2 is a simplified sectional view of an electronic device using a substrate composed of a substrate body and a acoustic multilayer formed on the surface thereof.

FIG. 2 is a simplified sectional view of an electronic device 20 using a substrate 11 composed of a substrate body 21 and an acoustic multilayer 22 formed on the surface thereof. This structure is suitable for an invention electronic device for use as a film bulk acoustic wave resonator.

As the substrate 21 can be used, for example, a single crystal substrate of silicon (Si), sapphire or the like, a ceramic substrate of alumina, AlTiC or the like, or a quartz or glass substrate. The acoustic multilayer 22 is constituted of alternately stacked reflective films 22A and 22B made of different material from each other. These layers enhance the characteristics of the film bulk acoustic wave resonator by reflecting vibration propagating toward the substrate body 21. The material used for the reflective films 22A can, for example, be aluminum nitride (AlN) and the material used for the reflective films 22B can, for example, be silicon oxide ($SiO_2$). When made of aluminum nitride (AlN), the reflective films 22A are preferably formed by sputtering. When made of silicon oxide ($SiO_2$), the reflective films 22B are preferably formed by CVD. The thickness of the reflective films 22A and 22B can be defined as appropriate for the desired resonant frequency.

Lower Conductive Film 12

The lower conductive film 12 is formed on the underside of the functional film 13 in the device structure. When a piezoelectric material of wurtzite crystal structure such as AlN, ZnO or GaN is used as the material of the functional film 13, the lower conductive film 12 is preferably a metallic film oriented in the (111) plane of a face-centered cubic structure or the (0001) plane of a hexagonal close-packed structure. The film oriented in the (111) plane of a face-centered cubic structure referred to here is a film wherein the reflection peak intensity in θ–2θ X-ray diffraction of planes other than an (hhh) plane is not greater than 10% of the maximum reflection peak intensity of the (hhh) plane. The symbol (hhh) refers generally to planes represented by assigning h an integral value, such as the (111) and (222) planes.

When the lower conductive film 12 of face-centered cubic structure (111) orientation or hexagonal close-packed structure (0001) orientation is formed thereon with a functional film 13 composed of a wurtzite structure piezoelectric material such as AlN, ZnO or GaN, it becomes possible to form a functional film 13 having excellent crystallinity by, for example, epitaxial growth.

The crystallinity of the lower conductive film 12 is preferably such that the X-ray rocking curve FWHM of the face-centered cubic (111) plane reflection or the hexagonal close-packed (0002) plane reflection in X-ray diffraction is not greater than 5 degrees and more preferably not greater than 3 degrees.

Figure 3:
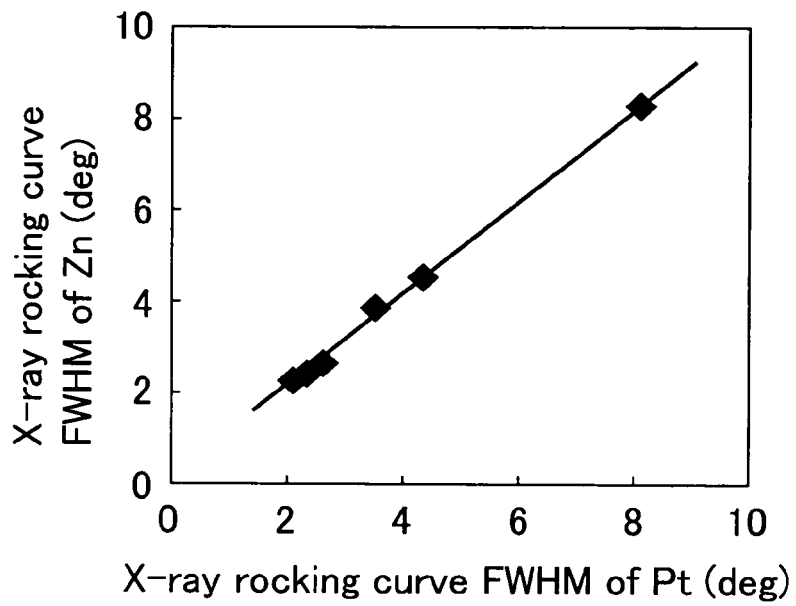
FIG. 3 is a graph showing how the crystallinity of a functional film varies with the crystallinity of a lower conductive film.

FIG. 3 is a graph showing how the crystallinity of the functional film 13 varies with the crystallinity of the lower conductive film 12 in the case where a Pt film with (111) single orientation is used as the lower conductive film 12 and a ZnO film is used as the functional film 13. As shown in FIG. 3, the X-ray rocking curve FWHM of the Pt film and the X-ray rocking curve FWHM of the ZnO exhibit substantially the same values, so that the crystallinity of the ZnO improves in proportion as the crystallinity of the Pt film on which it is formed improves (as the X-ray rocking curve FWHM of the Pt film decreases).

Figure 4:
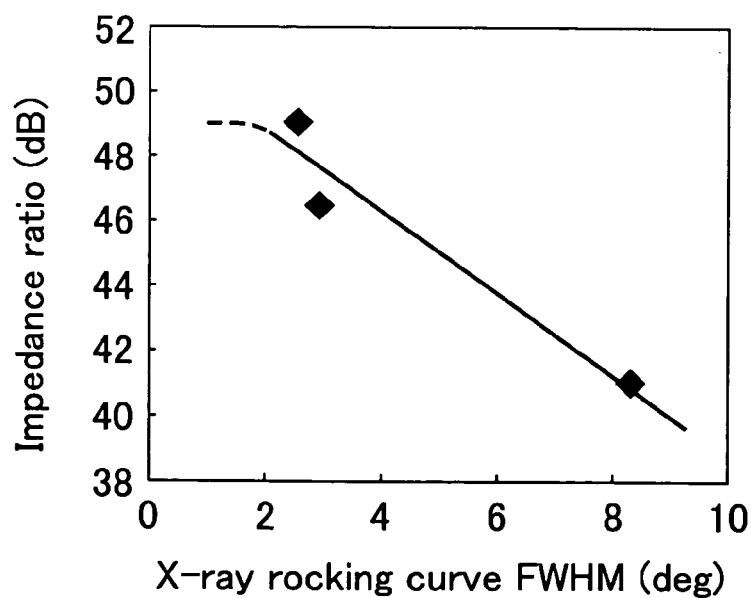
FIG. 4 is a graph showing how the impedance ratio of a film bulk acoustic wave resonator varies with the crystallinity of the functional film.
Figure 5:
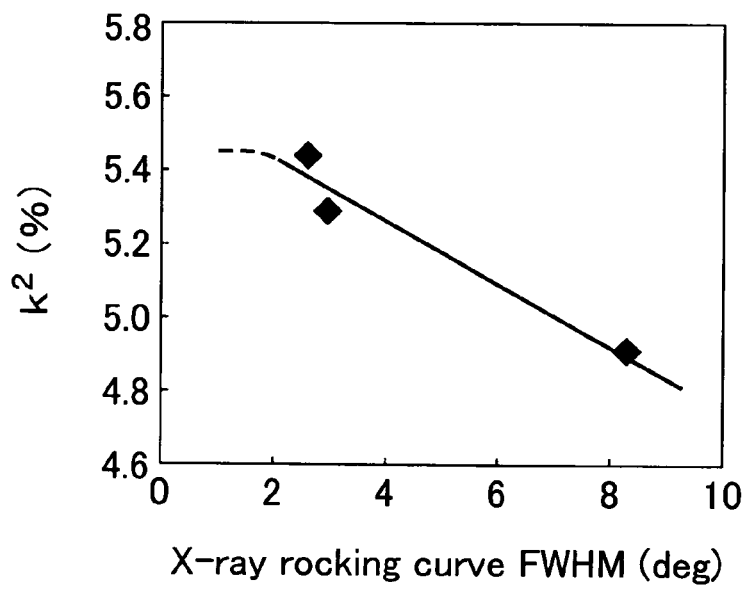
FIG. 5 is a graph showing how the effective electromechanical coupling factor ($k^2$) of a film bulk acoustic wave resonator varies with the crystallinity of the functional film.

FIG. 4 is a graph showing how the impedance ratio of the film bulk acoustic wave resonator (ratio of the resonance impedance and the antiresonance impedance) varies with the crystallinity of the functional film 13, and FIG. 5 is a graph showing how the effective electromechanical coupling factor ($k^2$) of the film bulk acoustic wave resonator varies with the crystallinity of the functional film 13. Both graphs are for the case where a ZnO film is used as the functional film 13. As can be seen from FIGS. 4 and 5, fairly good values can be obtained for both the resonance/antiresonance impedance ratio and the effective electromechanical coupling factor insofar as the X-ray rocking curve FWHM of the ZnO is not greater than 5 degrees, and both the resonance/antiresonance impedance ratio and the effective electromechanical coupling factor assume values near maximum when the X-ray rocking curve FWHM of the ZnO is not greater than 3 degrees.

Taking all of the foregoing into consideration, it follows that a film bulk acoustic wave resonator having relatively good characteristics can be fabricated if the crystallinity of the lower conductive film 12 expressed as the X-ray rocking curve FWHM is not greater than 5 degrees and a film bulk acoustic wave resonator having excellent characteristics can be fabricated if the crystallinity of the lower conductive film 12 expressed as the X-ray rocking curve FWHM is not greater than 3 degrees.

The lower conductive film 12 is required to have excellent adhesion on the substrate 11 side. This is because when the adhesion of the lower conductive film 12 is weak, the mechanical strength of the device becomes insufficient and, in the case of configuring a film bulk acoustic wave resonator, the resonance characteristics are degraded. Specifically, the adhesion of the lower conductive film 12 with respect to the layer of the substrate 11 it contacts must be not less than 0.1 N/cm and is preferably not less than 1 N/cm. This is because when a film bulk acoustic wave resonator is fabricated, its characteristics are markedly degraded when the adhesion of the lower conductive film 12 is below 0.1

N/cm, while substantially no degradation arises when the adhesion of the lower conductive film 12 is 1 N/cm or greater.

It is particularly preferable for the adhesion of the lower conductive film 12 to be not less than the 1.18 N/cm specified by JIS Z 1522 as the adhesive force of adhesive tape. Or, otherwise, adhesion around a level that prevents peeling in a tape test is preferable. No upper limit is defined for the adhesion. Greater adhesion improves the mechanical strength of the device and enables fabrication of an electronic device excellent in reliability.

The material of the lower conductive film 12 preferably contains as its main component at least one of platinum (Pt), gold (Au), iridium (Ir), osmium (Os), rhenium (Re), palladium (Pd), rhodium (Rh) and ruthenium (Ru). Platinum (Pt), gold (Au), iridium (Ir), palladium (Pd) and rhodium (Rh) assume a face-centered cubic structure and osmium (Os), rhenium (Re) and ruthenium (Ru) assume a hexagonal close-packed structure. The surfaces of these metals are easy to keep clean and when fouled can be readily cleaned by ashing or heat treatment. A clean surface of the lower conductive film 12 facilitates the formation of the functional film 13 made of ZnO or other with good crystallinity.

The lower conductive film 12 is not limited to the foregoing metals, however, and can instead be formed of, for example, a film of body-centered cubic structure metal such as molybdenum (Mo) or tungsten (W) or a film of a perovskite structure oxide conductor such $SrRuO_3$. Since adhesion to the underlying base also varies markedly with the production conditions when any of these materials is used, it is again necessary to establish conditions for ensuring the aforesaid degree of adhesion.

The thickness of the lower conductive film 12 is preferably 10–1000 nm, more preferably 50–300 nm. This is because the lower conductive film 12 becomes inappropriate as an electrode owing to large sheet resistance when thinner than 10 nm, while the production process time and material cost become unnecessarily large when it is thicker than 1000 nm. Moreover, when the electronic device of this embodiment is used as a film bulk acoustic wave resonator, its resonant frequency varies with the thickness of the lower conductive film 12, so that the thickness of the lower conductive film 12 is preferably set based on the desired resonant frequency.

The lower conductive film 12 is preferably formed by vacuum deposition, sputtering or CVD. Among these, sputtering is particularly preferable. This is because strong adhesion can be obtained by the sputtering method in the case of forming the lower conductive film 12 directly on the substrate 11 as in the electronic devices 10, 20 according to this embodiment. The substrate temperature during formation of the lower conductive film 12 by sputtering is preferably 300–800° C., more preferably 400–600° C. This is because a substrate temperature below 800° C. results in insufficient adhesion of the lower conductive film 12 on the side of the substrate 11, thereby lowering the reliability of the electronic device and/or degrading its characteristics. In the case where the electronic device is configured for use as a film bulk acoustic wave resonator, formation of the lower conductive film 12 by sputtering with the substrate temperature set lower than 300° C. is particularly disadvantageous because it results in markedly degraded filter characteristics. On the other hand, when the substrate temperature is higher than 800° C., the metallic film constituting the lower conductive film 12 experiences surface property degeneration and/or occurrence of pinholes. In contrast, when the substrate temperature during formation of the lower conductive film 12 by sputtering is set between 400 and 600° C., very strong adhesion of the metallic film constituting the lower conductive film 12 can be achieved while maintaining good surface property thereof.

Functional Film 13

As explained earlier, materials usable for the functional film 13 include piezoelectric materials of wurtzite crystal structure such as ZnO, AlN or GaN and ferroelectric materials such as PZT. When an piezoelectric material such as ZnO is used as the material of the functional film 13, for example, the electronic device 10 of this embodiment can be used as a film bulk acoustic wave resonator, ink-jet printer head or other such electronic device, while if a ferroelectric material such as PZT is used as the functional film 13, the electronic device 10 of this embodiment can be used as a ferroelectric nonvolatile memory, film capacitor or other such electronic device.

As mentioned earlier, the X-ray rocking curve FWHM of the functional film 13 is preferably not greater than 5 degrees, more preferably not greater than 3 degrees. The X-ray rocking curve FWHM of the functional film 13 can be controlled to such a value by, as explained earlier, forming the lower conductive film 12 serving as its base so as to have an X-ray rocking curve FWHM of not greater than 5 degrees, preferably not greater than 3 degrees. This enables fabrication of an electronic device having good characteristics.

When the functional film 13 is made of a piezoelectric material of wurtzite crystal structure such as AlN or ZnO, it is preferably formed by a sputtering method such as RF magnetron sputtering, DC sputtering or ECR sputtering, or by CVD (chemical vapor deposition), MBE (molecular beam epitaxy) or vacuum deposition. Among these, it is preferable to use a sputtering method, particularly the RF magnetron sputtering method. This is because RF magnetron sputtering enables ready formation of an AlN or Zn film of high crystallinity with single c-axis orientation. When AlN is used, it is preferable to adopt reactive RF magnetron sputtering. In this case, an excellent AlN film can be formed by using Al metal for the cathode, introducing Ar and nitrogen gas, and conducting the reactive RF magnetron sputtering at a substrate temperature of around 200° C. A film excellent in crystallinity containing very little impurity can also be fabricated when ECR sputtering is used.

When the functional film 13 is made of a ferroelectric material such as PZT, it is preferably formed by vacuum deposition, sputtering, CVD or laser ablation. Vacuum deposition and sputtering are particularly preferable. The vapor deposition method known as reactive vapor deposition is particularly advantageous in enabling fabrication of a ferromagnetic film of high crystallinity and uniform thickness.

The thickness of the functional film 13 must be appropriately defined in accordance with the type and required characteristics of the electronic device. When the electronic device is to be used as a film bulk acoustic wave resonator, for example, the thickness of the functional film 13 needs to be set thinner in proportion as the resonant frequency is set higher.

Upper Conductive Film 14

The material of the upper conductive film 14 is required to be electrically conductive but is otherwise not particularly limited. The upper conductive film 14 can be formed of a metal such as aluminum (Al), gold (Au) or platinum (Pt), an alloy of these metals and copper (Cu), or the like, or a multilayer film obtained by stacking layers of these metals and titanium (Ti) or the like. The upper conductive film 14 need not necessarily be a film formed by epitaxial growth. In addition, it is preferable to interpose a protective film between the functional film 13 and the upper conductive film 14. Silicon oxide (SiO$_2$) or the like can be used as the material of the protective film.

The upper conductive film 14 is preferably given a thickness of 50 nm–1 μm. This is because electrical discontinuity or other such defect is likely to occur when the thickness of the upper conductive film 14 is less than 50 nm and the processability of the upper conductive film 14 becomes exceedingly poor at a thickness greater than 1 μm. When the electronic device according to this embodiment is to be used as a film bulk acoustic wave resonator, its resonant frequency varies with the thickness of the upper conductive film 14, similarly as it does with the thickness of the lower conductive film 12. The thickness of the upper conductive film 14 is therefore preferably defined based on the desired resonant frequency.

The structures of the electronic devices 10, 20 of this embodiment are as described in the foregoing. In the electronic devices 10, 20 of this embodiment, the fact that the adhesion between the lower conductive film 12 and the substrate 11 on which it is formed is strong makes it possible to provide an electronic device product of enhanced mechanical strength and high reliability. Good signal characteristics can therefore be obtained even when the electronic device 10 or 20 of this embodiment is used as a film bulk acoustic wave resonator.

Another preferred embodiments of the electronic device according to the present invention will now be explained.

Figure 6:
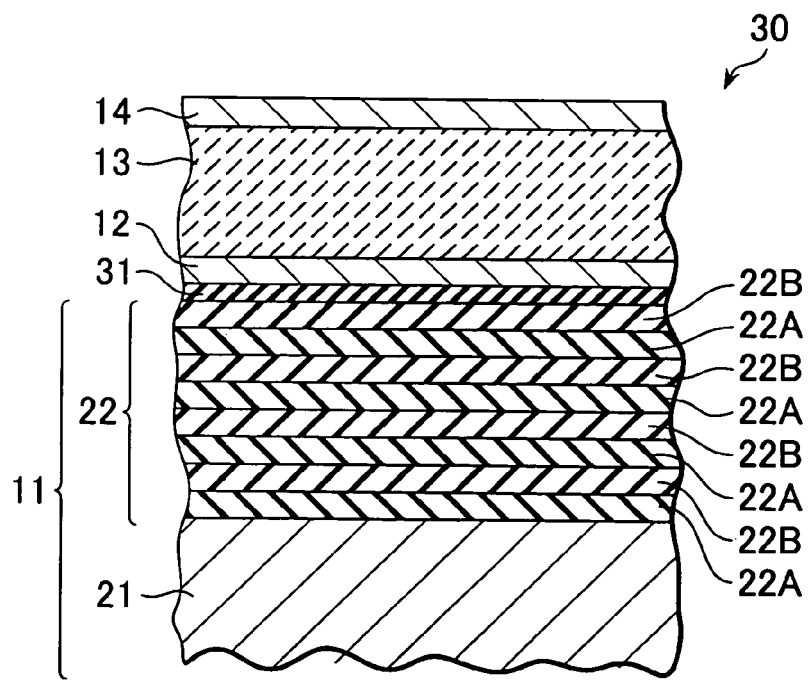
FIG. 6 is a simplified sectional view showing the structure of an electronic device that is another preferred embodiment of the present invention.

FIG. 6 is a simplified sectional view showing the structure of an electronic device 30 that is another preferred embodiment of the present invention.

As shown in FIG. 6, the electronic device 30 of this embodiment is additionally provided with an adhesion orientation control film 31 interposed between the substrate 11 and lower conductive film 12 of the electronic device shown in FIG. 2. The adhesion orientation control film 31 functions to increase the adhesion of the lower conductive film 12 on the side of the substrate 11, thereby enabling adhesion of 0.1 N/cm or greater to be readily achieved on the substrate 11 side of the lower conductive film 12.

The adhesion orientation control film 31 is preferably constituted of a crystal having a wurtzite crystal structure. The material thereof is preferably a nitrogen compound of at least one element selected from among Group III elements such as aluminum (Al), gallium (Ga) and indium (In), or an oxide or sulfide of a Group II element such as beryllium (Be) or zinc (Zn). AlN is the most preferable material for the adhesion orientation control film 31 because it is stable in the atmosphere and can be easily formed into a film of high crystallinity by reactive sputtering.

The adhesion orientation control film 31 is preferably a (0001) oriented film having the (0001) plane of a wurtzite crystal structure lying parallel to the surface of the substrate body 21 and is more preferably a (0001) single oriented film. The (0001) plane of the wurtzite crystal structure can be viewed as a structure in which atoms are aligned at the center and apex positions of a regular hexagon. When a metal whose crystal structure is a face-centered cubic structure or a hexagonal close-packed structure is deposited on a (0001) oriented wurtzite film of such atom alignment, it is possible to readily form a metallic film oriented in a face-centered (111) plane or hexagonal closed-packed plane having the same regular hexagon atom alignment. The provision of the adhesion orientation control film 31 therefore increases the crystallinity of the lower conductive film 12 and this in turn increases the crystallinity of the functional film 13.

If in the X-ray diffraction method the maximum reflection peak intensity of the (000L) plane by θ–2θ X-ray diffraction is greater than the reflection peaks of planes other than (000L), the film can be said to have (0001) orientation. If, in addition, the reflection peak intensities of planes other than the (000L) plane are not greater than 10% of the maximum peak intensity of the (000L) plane reflection, the film can be said to be a (0001) single oriented film. The symbol (000L) here refers generally to planes represented by assigning L an integral value, such as the (0001) and (0002) planes.

Moreover, the film can be said to be a (0001) oriented wurtzite film if the wurtzite crystal (0001) diffraction pattern is observed when the film surface is observed by RHEED (reflection high-energy electron diffraction).

The orientation of the adhesion orientation control film 31 can also be ascertained by using a transmission electron microscope to observe the film from a sectional surface or top (bottom) surface and determining the crystal orientation from the diffraction pattern obtained.

When the adhesion orientation control film 31 is extremely thin, the aforesaid comparison of the X-ray diffraction peak intensities is difficult owing to the impossibility of obtaining sufficient X-ray diffraction intensities. Moreover, when another adhesion orientation control film composed of the same constituent elements is present, the orientation of the adhesion orientation control film 31 may be difficult to ascertain owing to the impossibility of isolating its X-ray diffraction peak. In such cases, the orientation is preferably ascertained by RHEED or observation with a transmission electron microscope.

The adhesion orientation control film 31 is preferably a crystal film, more preferably a (0001) oriented polycrystal film, still more preferably a (0001) oriented single crystal film. As explained earlier, when the adhesion orientation control film 31 has (0001) orientation, the lower conductive film 12 formed thereon can be formed to have good crystallinity. When the adhesion orientation control film 31 is a (0001) oriented single crystal film, it is possible to form thereon a (111) oriented face-centered cubic metallic film or (0001) oriented hexagonal close-packed lower conductive film 12 of excellent crystallinity.

The thickness of the adhesion orientation control film 31 can be selected to be suitable for the desired characteristics of the electronic device. When the electronic device is fabricated as a filter utilizing a film bulk acoustic wave resonator, for example, the thickness of the adhesion orientation control film 31 can be selected to optimize the bandwidth, minimum insertion loss, attenuation and temperature characteristics of the filter. When the characteristics of the device do not depend on the thickness of the adhesion orientation control film 31 or are not important, it is ordinarily preferable to set the thickness at 1–1000 nm. This is because when the thickness of the adhesion orientation control film 31 is under 1 nm, the adhesion orientation control film cannot be formed to have adequate crystallinity, making it impossible to form a lower conductive film 12 with good crystallinity, while other problems also arise, such as that the adhesion of the lower conductive film 12 is insufficient. On the other hand, when the thickness of the adhesion orientation control film 31 exceeds 1000 nm, the long time required to form it lowers throughput during production. The average roughness (Ra) of the surface of the adhesion orientation control film 31 is preferably not greater than 10 nm, more preferably not greater than 1 nm.

The adhesion orientation control film 31 is preferably formed by sputtering, CVD (chemical vapor deposition), MBE (molecular beam epitaxy) or vacuum deposition. Active RF magnetron sputtering is preferably used particularly when AlN is used as the material of the adhesion orientation control film 31. In this case, an excellent AlN film can be formed by using Al metal for the cathode, introducing Ar and nitrogen gas, and conducting the reactive RF magnetron sputtering at a substrate temperature of around 200° C.

Figure 7:
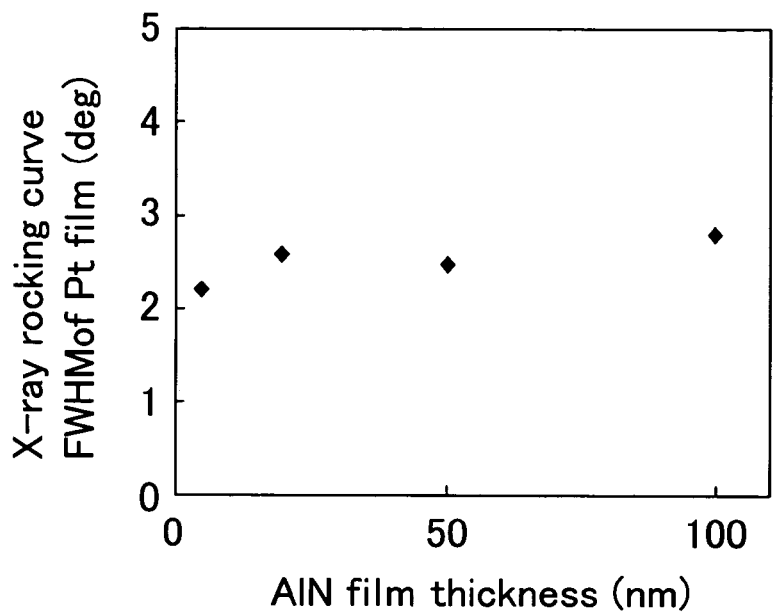
FIG. 7 is a graph showing how the X-ray rocking curve FWHM of a Pt film constituting the lower conductive film varies with the thickness of an AlN film constituting an adhesion orientation control film.

A study conducted by the inventors revealed that an AlN film formed by reactive RF magnetron sputtering to a thickness of about 5 nm can impart sufficient crystallinity and adhesion as the base of a metallic film. FIG. 7 shows how the X-ray (111) reflection rocking curve FWHM of a Pt film formed by vacuum deposition on AlN formed by reactive RF magnetron sputtering varied with the thickness of the AlN. As shown in FIG. 7, Pt films of comparable crystallinity could be obtained over a range of AlN film thicknesses between 5 and 100 nm. All of these Pt films exhibited good adhesion, and none experienced peeling in a tape test.

Although the substrate 11 used in this embodiment consists of the substrate body 21 having the acoustic multilayer 22 formed on its surface, the base of the adhesion orientation control film 31 is not limited to one of this type and the adhesion orientation control film 31 may instead be formed directly on a substrate body made of silicon (Si), glass or the like.

When the adhesion orientation control film 31 is interposed between the substrate 11 and lower conductive film 12 as in this embodiment, the lower conductive film 12 is preferably formed by vacuum deposition. This is because use of vacuum deposition enables formation of a lower conductive film 12 with particularly good crystallinity. Although a film formed using vacuum deposition tends to have lower adhesion than one formed by sputtering, the presence of the adhesion orientation control film 31 in this embodiment makes it possible to secure strong adhesion even when using vacuum deposition. Even when the adhesion orientation control film 31 is present, however, the adhesion of the lower conductive film 12 on the side of the substrate 11 still depends on the substrate temperature during formation of the lower conductive film 12. In order to ensure adequate adhesion, the substrate temperature during formation of the lower conductive film 12 by vacuum deposition should preferably be set at 200–800° C. This is because at a substrate temperature under 200° C., the adhesion of the lower conductive film 12 on the side of the substrate 11 is liable to become deficient even when the adhesion orientation control film 31 is present. On the other hand, when the substrate temperature is higher than 800° C., the metallic film constituting the lower conductive film 12 is, as pointed out earlier, liable to experience surface property degeneration and/or occurrence of pinholes.

In order to further improve the crystallinity of the lower conductive film 12 formed by vacuum deposition, the substrate temperature during formation of the lower conductive film 12 by vacuum deposition is preferably set at 300–800° C., more preferably 400–600° C.

The structure of the electronic device 30 of this embodiment is as described in the foregoing. In the electronic device 30 of this embodiment, the adhesion orientation control film 31 provided between the lower conductive film 12 and substrate 11 increases the adhesion of the lower conductive film 12 on the side of the substrate 11 to enable provision of an electronic device product of enhanced mechanical strength and high reliability.

An electronic device that is further preferred embodiment of the present invention will now be explained.

Figure 8:
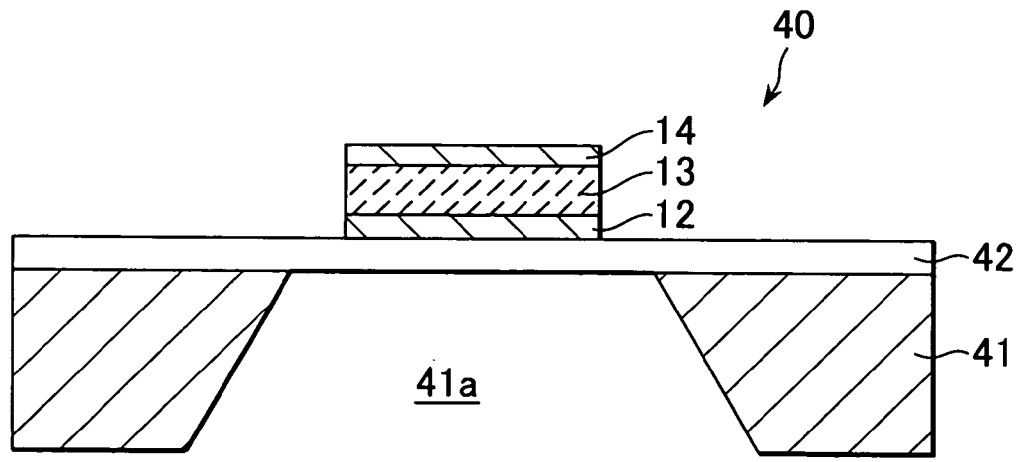
FIG. 8 is a simplified sectional view showing the structure of an electronic device that is a further preferred embodiment of the present invention.

FIG. 8 is a simplified sectional view showing the structure of an electronic device 40 that is a further preferred embodiment of the present invention.

The electronic device 40 of this embodiment is a film bulk acoustic wave resonator. As shown in FIG. 8, the electronic device 40 comprises a substrate body 41 having a via hole 41a, a buffer layer 42 formed on the substrate body 41, a lower conductive film 12 formed on the buffer layer 42, a functional film 13 formed on the lower conductive film 12, and an upper conductive film 14 formed on the functional film 13.

The substrate body 41 is preferably made of single crystal silicon, most preferably of a substrate having a Si (100) single crystal surface. This is because use of a Si (100) substrate facilitates formation of the via hole 41a. The via hole 41a is formed, for example, by removing part of the substrate body 41 by etching or the like or by removing part or all of a once-formed film in the manner of a sacrificial layer or the like.

The buffer layer 42 serves as a base for the lower conductive film 12 and also functions as an etching stopper layer when the via hole 41a is formed by etching. The material of the buffer layer 42 is preferably the same as that of the adhesion orientation control film 31 in the preceding embodiment, namely a material having a wurtzite crystal structure. Use of such a material not only enhances the crystallinity of the lower conductive film 12 but also enables adhesion of 0.1 N/cm or greater to be readily achieved on the substrate 41 side of the lower conductive film 12.

As the electronic device 40 of this embodiment thus has a diaphragm structure configured by forming the via hole 41a in the substrate body 41, it enables provision of a high-performance film bulk acoustic wave resonator.

The present invention has thus been shown and described with reference to specific embodiments. However, it should be noted that the present invention is in no way limited to the details of the described arrangements but changes and modifications may be made without departing from the scope of the appended claims.

WORKING EXAMPLES AND COMPARATIVE EXAMPLES

Here follows a description of working examples of the present invention, but the present invention is in no way limited to these examples.

Example 1

In Example 1, a number of electronic devices having the structure of the electronic device 20 shown in FIG. 2 were fabricated by the following method.

First, a Si (100) substrate body 21 composed of mirror-polished Si single crystal and having a thickness of 250 μm and a resistivity of 1000 Ω·cm was prepared and washed. Next, the acoustic multilayer 22 was formed by repeating four cycles of a process in which a 1.5 μm thick AlN film formed by sputtering and an 8 μm thick $SiO_2$ film formed by CVD were alternately overlaid in this order. This completed the fabrication of the substrate 11 serving as the base of the lower conductive film 12.

A 150 nm thick lower conductive film 12 composed of platinum (Pt) was then formed on the substrate 11. The lower conductive film 12 was formed by sputtering, using platinum (Pt) as the target and argon (Ar) as the sputter gas. As film-forming conditions, the substrate temperature was set at 600° C. and the film-forming rate at 0.06 nm/s.

Next, an 800 nm thick functional film 13 composed of ZnO was formed on the lower conductive film 12 by RF magnetron sputtering.

A 50 nm thick $SiO_2$ film was thereafter formed on the functional film 13 as a protective layer by CVD, and an upper conductive film 14 composed of aluminum (Al) was formed on the protective layer by sputtering. A number of Example 1 electronic devices (film bulk acoustic wave resonators) were produced in the foregoing manner.

Each of the so-fabricated electronic devices was connected to a prescribed circuit to fabricate an equal number of bandpass filters having passbands of 2.00–2.05 GHz, and the insertion loss in the passband was measured. No bandpass filter was found to have an insertion loss in the passband of 3 dB or greater.

In addition, the lower conductive film 12 was subjected to a peel test in its state immediately after formation, i.e., before formation of the functional film 13, thereby measuring the adhesion of the lower conductive film 12 on the side of the substrate 11. The adhesion of the lower conductive film 12 was found to be 2.28 N/cm.

Example 2

In Example 2, a number of electronic devices were fabricated in the same manner as in Example 1, except that the substrate temperature during formation of the lower conductive film 12 by sputtering was set at 500° C.

When bandpass filters fabricated using the Example 2 electronic devices were measured for insertion loss in the passband, none of the bandpass filters was found to have an insertion loss in the passband of 3 dB or greater. The adhesion of the lower conductive film 12 measured by the method of Example 1 was 2.20 N/cm.

Example 3

In Example 3, a number of electronic devices were fabricated in the same manner as in Example 1, except that the substrate temperature during formation of the lower conductive film 12 by sputtering was set at 450° C.

When bandpass filters fabricated using the Example 3 electronic devices were measured for insertion loss in the passband, none of the bandpass filters was found to have an insertion loss in the passband of 3 dB or greater. The adhesion of the lower conductive film 12 measured by the method of Example 1 was 2.15 N/cm.

Example 4

In Example 4, a number of electronic devices were fabricated in the same manner as in Example 1, except that the substrate temperature during formation of the lower conductive film 12 by sputtering was set at 400° C.

When bandpass filters fabricated using the Example 4 electronic devices were measured for insertion loss in the passband, none of the bandpass filters was found to have an insertion loss in the passband of 3 dB or greater. The adhesion of the lower conductive film 12 measured by the method of Example 1 was 1.30 N/cm.

Example 5

In Example 5, a number of electronic devices were fabricated in the same manner as in Example 1, except that the substrate temperature during formation of the lower conductive film 12 by sputtering was set at 350° C.

When bandpass filters fabricated using the Example 5 electronic devices were measured for insertion loss in the passband, 4% of the bandpass filters were found to have an insertion loss in the passband of 3 dB or greater. The adhesion of the lower conductive film 12 measured by the method of Example 1 was 0.35 N/cm.

Example 6

In Example 6, a number of electronic devices were fabricated in the same manner as in Example 1, except that the substrate temperature during formation of the lower conductive film 12 by sputtering was set at 300° C.

When bandpass filters fabricated using the Example 6 electronic devices were measured for insertion loss in the passband, 8% of the bandpass filters were found to have an insertion loss in the passband of 3 dB or greater. The adhesion of the lower conductive film 12 measured by the method of Example 1 was 0.12 N/cm.

Comparative Example 1

In Comparative Example 1, a number of electronic devices were fabricated in the same manner as in Example 1, except that the substrate temperature during formation of the lower conductive film 12 by sputtering was set at 200° C.

When bandpass filters fabricated using the Comparative Example 1 electronic devices were measured for insertion loss in the passband, 58% of the bandpass filters were found to have an insertion loss in the passband of 3 dB or greater. The adhesion of the lower conductive film 12 measured by the method of Example 1 was 0.09 N/cm.

Comparative Example 2

In Comparative Example 2, a number of electronic devices were fabricated in the same manner as in Example 1, except that the substrate temperature during formation of the lower conductive film 12 by sputtering was set at 100° C.

When bandpass filters fabricated using the Comparative Example 2 electronic devices were measured for insertion loss in the passband, 72% of the bandpass filters were found to have an insertion loss in the passband of 3 dB or greater. The adhesion of the lower conductive film 12 measured by the method of Example 1 was 0.05 N/cm.

Comparative Example 3

In Comparative Example 3, a number of electronic devices were fabricated in the same manner as in Example 1, except that the substrate temperature during formation of the lower conductive film 12 by sputtering was set at room temperature (23° C.).

When bandpass filters fabricated using the Comparative Example 3 electronic devices were measured for insertion loss in the passband, 68% of the bandpass filters were found to have an insertion loss in the passband of 3 dB or greater. The adhesion of the lower conductive film 12 measured by the method of Example 1 was 0.03 N/cm.

The measurement results obtained for the electronic devices (and bandpass filters) of Examples 1–6 and Comparative Examples 1–3 are summarized in Table 1.

TABLE 1

|  | Film-forming temp. (° C.) | Adhesion (N/cm) | Defect rate (%) |
|---|---|---|---|
| Example 1 | 600 | 2.28 | 0 |
| Example 2 | 500 | 2.20 | 0 |
| Example 3 | 450 | 2.15 | 0 |
| Example 4 | 400 | 1.30 | 0 |
| Example 5 | 350 | 0.35 | 4 |
| Example 6 | 300 | 0.12 | 8 |
| Comparative Example 1 | 200 | 0.09 | 58 |
| Comparative Example 2 | 100 | 0.05 | 72 |
| Comparative Example 3 | 23 | 0.03 | 68 |

Figure 9:
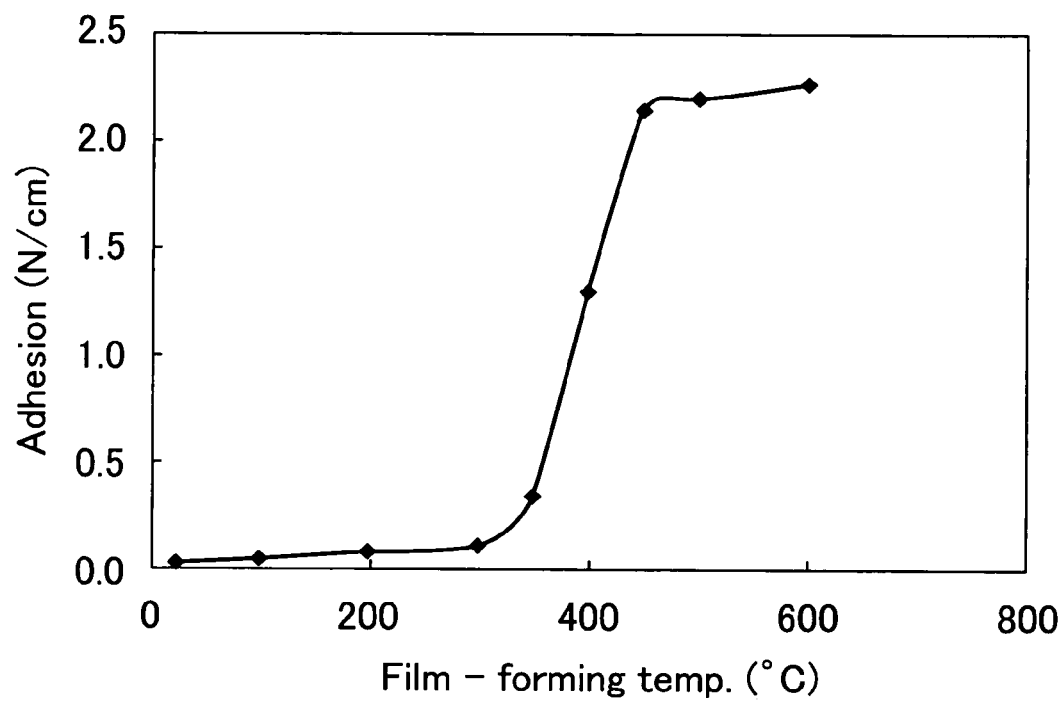
FIG. 9 is a graph showing how adhesion varies with the substrate temperature during formation of the lower conductive film by sputtering.
Figure 10:
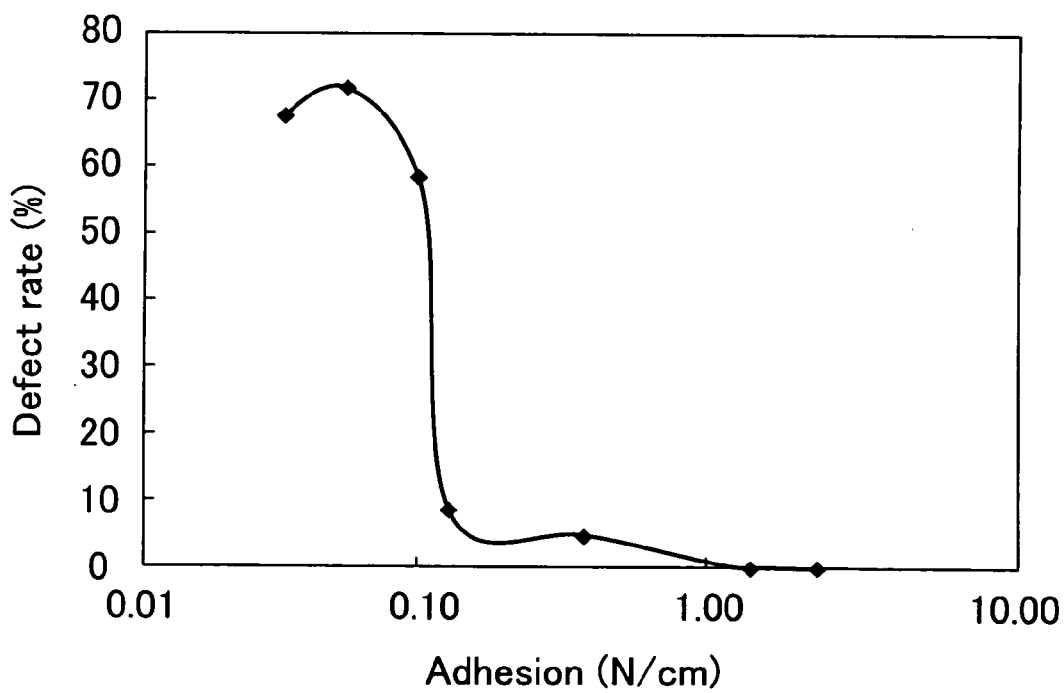
FIG. 10 is a graph showing how the defect rate of a band pass filter varies with the adhesion of the lower conductive film.

FIG. 9 further shows how adhesion varies with substrate temperature when the lower conductive film 12 is formed, and FIG. 10 shows how the defect rate of a bandpass filter (percentage of products whose insertion loss in the passband is 3 dB or greater) varies with adhesion.

As shown in Table 1, the adhesion of the lower conductive film 12 is 0.1 N/cm or greater when the substrate temperature during formation of the lower conductive film 12 is 300° C. or higher. As shown in FIG. 10, the bandpass filter defect rate drops sharply as the adhesion of the lower conductive film 12 rises above 0.1 N/cm and falls to zero when the adhesion rises above around 1 N/cm. From these facts it was ascertained that the device characteristics of the product can be markedly improved by increasing the adhesion of the lower conductive film 12 to 0.1 N/cm or greater, particularly to 1 N/cm or greater.

As shown in FIG. 9, the adhesion of the lower conductive film 12 increases sharply as the substrate temperature during formation rises above 400° C. From this it was ascertained that when the lower conductive film 12 is formed by sputtering, the reliability of the product can be markedly improve by setting the substrate temperature at 400° C. or higher.

Test Sample 1

The structure obtained by omitting the functional film 13 and upper conductive film 14 from the electronic device shown in FIG. 6 was fabricated as Test Sample 1 by the method explained below. In this Test Sample 1, and also in Test Samples 2–16 set out later, the purpose of omitting the functional film 13 and upper conductive film 14 was to enable measurement of the adhesion of the lower conductive film 12 of the Test Sample.

First, a Si (100) substrate body 21 composed of mirror-polished Si single crystal and having a thickness of 250 µm and a resistivity of 1000 Ω·cm was prepared and washed. Next, the acoustic multilayer 22 was formed by repeating four cycles of a process in which a 1.5 µm thick AlN film formed by sputtering and an 8 µm thick $SiO_2$ film formed by CVD were alternately overlaid in this order. This completed the fabrication of the substrate 11 serving as the base of the lower conductive film 12.

Next, an adhesion orientation control film 31 consisting of a 50 nm thick AlN film was formed on the substrate 11 by reactive RF magnetron sputtering using a metal Al target and a mixed gas of Ar and $N_2$. The substrate temperature was set at about 200° C.

A 150 nm thick lower conductive film 12 composed of platinum (Pt) was then formed on the adhesion orientation control film 31. The lower conductive film 12 was formed by vacuum deposition. As film-forming conditions, the substrate temperature was set at 800° C. and the film-forming rate at 0.06 nm/s. This completed Test Sample 1.

Test Sample 1 was subjected to a peel test, thereby measuring the adhesion of the lower conductive film 12 on the side of the substrate 11. The adhesion of the lower conductive film 12 was found to be 2.68 N/cm.

Test Sample 2

Test Sample 2 was fabricated in the same manner as Test Sample 1, except that the substrate temperature during formation of the lower conductive film 12 by vacuum deposition was set at 700° C. The adhesion of the lower conductive film 12 measured by the method used for Test Sample 1 was 2.62 N/cm.

Test Sample 3

Test Sample 3 was fabricated in the same manner as Test Sample 1, except that the substrate temperature during formation of the lower conductive film 12 by vacuum deposition was set at 600° C. The adhesion of the lower conductive film 12 measured by the method used for Test Sample 1 was 2.58 N/cm.

Test Sample 4

Test Sample 4 was fabricated in the same manner as Test Sample 1, except that the substrate temperature during formation of the lower conductive film 12 by vacuum deposition was set at 500° C. The adhesion of the lower conductive film 12 measured by the method used for Test Sample 1 was 2.52 N/cm.

Test Sample 5

Test Sample 5 was fabricated in the same manner as Test Sample 1, except that the substrate temperature during formation of the lower conductive film 12 by vacuum deposition was set at 400° C. The adhesion of the lower conductive film 12 measured by the method used for Test Sample 1 was 2.35 N/cm.

Test Sample 6

Test Sample 6 was fabricated in the same manner as Test Sample 1, except that the substrate temperature during formation of the lower conductive film 12 by vacuum deposition was set at 300° C. The adhesion of the lower conductive film 12 measured by the method used for Test Sample 1 was 1.85 N/cm.

Test Sample 7

Test Sample 7 was fabricated in the same manner as Test Sample 1, except that the substrate temperature during formation of the lower conductive film 12 by vacuum deposition was set at 200° C. The adhesion of the lower conductive film 12 measured by the method used for Test Sample 1 was 1.24 N/cm.

Test Sample 8

Test Sample 8 was fabricated in the same manner as Test Sample 1, except that the substrate temperature during formation of the lower conductive film 12 by vacuum deposition was set at room temperature (23° C.). The adhesion of the lower conductive film 12 measured by the method used for Test Sample 1 was 0.048 N/cm.

Test Sample 9

Test Sample 9 was fabricated in the same manner as Test Sample 1, except that the adhesion orientation control film 31 was also omitted. The adhesion of the lower conductive film 12 measured by the method used for Test Sample 1 was 0.092 N/cm.

Test Sample 10

Test Sample 10 was fabricated in the same manner as Test Sample 2, except that the adhesion orientation control film 31 was also omitted. The adhesion of the lower conductive film 12 measured by the method used for Test Sample 1 was 0.081 N/cm.

Test Sample 11

Test Sample 11 was fabricated in the same manner as Test Sample 3, except that the adhesion orientation control film 31 was also omitted. The adhesion of the lower conductive film 12 measured by the method used for Test Sample 1 was 0.064 N/cm.

Test Sample 12

Test Sample 12 was fabricated in the same manner as Test Sample 4, except that the adhesion orientation control film 31 was also omitted. The adhesion of the lower conductive film 12 measured by the method used for Test Sample 1 was 0.058 N/cm.

Test Sample 13

Test Sample 13 was fabricated in the same manner as Test Sample 5, except that the adhesion orientation control film 31 was also omitted. The adhesion of the lower conductive film 12 measured by the method used for Test Sample 1 was 0.052 N/cm.

Test Sample 14

Test Sample 14 was fabricated in the same manner as Test Sample 6, except that the adhesion orientation control film 31 was also omitted. The adhesion of the lower conductive film 12 measured by the method used for Test Sample 1 was 0.039 N/cm.

Test Sample 15

Test Sample 15 was fabricated in the same manner as Test Sample 7, except that the adhesion orientation control film 31 was also omitted. The adhesion of the lower conductive film 12 measured by the method used for Test Sample 1 was 0.025 N/cm.

Test Sample 16

Test Sample 16 was fabricated in the same manner as Test Sample 8, except that the adhesion orientation control film 31 was also omitted. The adhesion of the lower conductive film 12 measured by the method used for Test Sample 1 was 0.005 N/cm.

Figure 11:
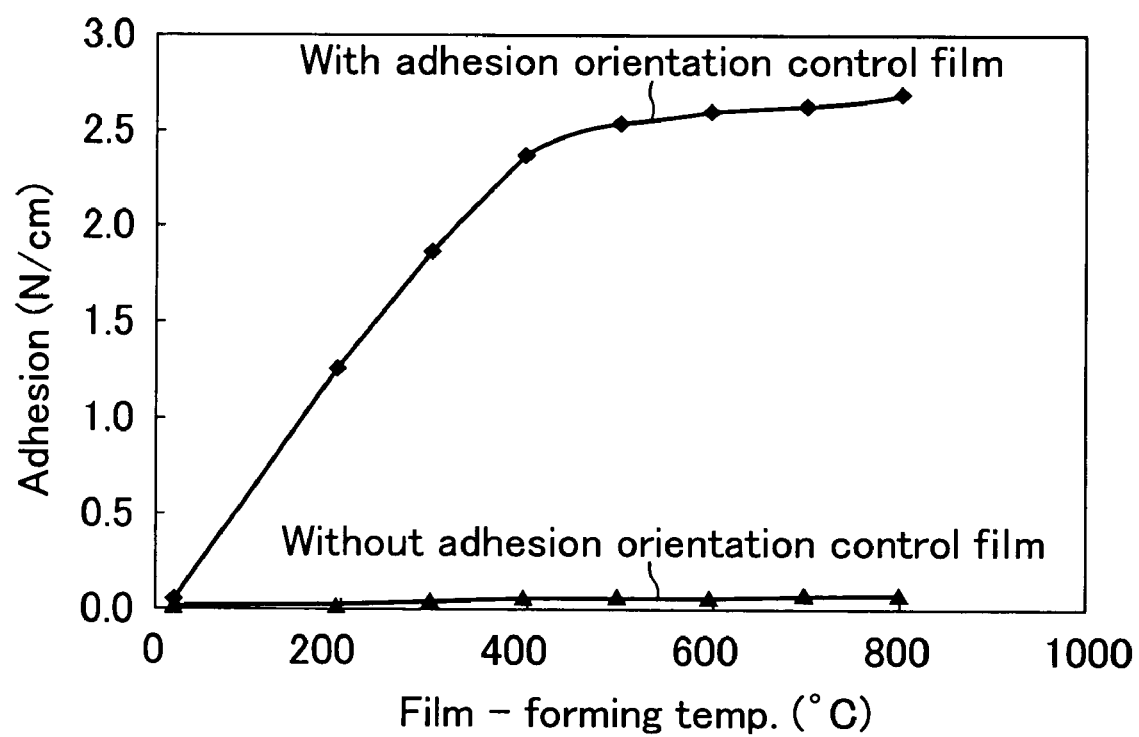
FIG. 11 is a graph showing how adhesion varies with substrate temperature during formation of the lower conductive film by vacuum deposition.

FIG. 11 is a graph representing the results of the measurements made on Test Samples 1–16, showing how adhesion varied with substrate temperature when the lower conductive film 12 was formed. As can be seen from FIG. 11, the adhesion of the lower conductive film 12 increased with increasing substrate temperature during formation when the adhesion orientation control film 31 was present, so that an adhesion of 1 N/cm or higher could be easily achieved. In contrast, when the adhesion orientation control film 31 was not present, the adhesion of the lower conductive film 12 did not reach or exceed 0.1 N/cm even when the substrate temperature was increased. From this it was ascertained that use of the adhesion orientation control film 31 as a base enables achievement of strong adhesion when the lower conductive film 12 is formed by vacuum deposition.

Example 7

In Example 7, after fabricating Test Sample 3 explained above, an 800 nm thick functional film 13 composed of ZnO was formed on the lower conductive film 12 thereof by RF magnetron sputtering. A 50 nm thick $SiO_2$ protective film and an upper conductive film 14 composed of aluminum (Al) were further formed on the functional film 13, thus fabricating an Example 7 electronic device (film bulk acoustic wave resonator).

The Example 7 electronic device fabricated in the foregoing manner was subjected to an X-ray diffraction test, from which it was learned that the lower conductive film 12 had face-centered cubic (111) orientation and an X-ray rocking curve FWHM of 2.3 degrees. Further, the ZnO film constituting the functional film 13 was found to have (0001) orientation and, from the fact that the ZnO (002) X-ray rocking curve FWHM was 2.5 degrees, to be a film of high crystallinity.

Measurement of the characteristics of the Example 7 electronic device (film bulk acoustic wave resonator) showed it to have excellent resonance characteristics, namely, a resonant frequency fr of 2.0 GHz, an antiresonant frequency fa of 2.06 GHz, an effective electromechanical coupling factor $(fa^2-fr^2)/fr^2$ of 6.0%, and a resonance•antiresonance impedance ratio of 50 dB.

A bandpass filter fabricated by connecting the Example 7 electronic device to a prescribed circuit exhibited good electric power resistance and pass characteristics.

When the Example 7 electronic device was subjected to a tape test using adhesive tape having adhesion of 0.1 N/cm, no peeling of any of the films was observed. From this it was ascertained that the interfaces between all films and the substrate constituting the Example 7 electronic device exhibited adhesion of not less than 0.1 N/cm.

Comparative Example 4

In Comparative Example 4, an electronic device (film bulk acoustic wave resonator) was fabricated in the manner of Example 7, except that Test Sample 11 was used instead of Test Sample 3. Measurement of the characteristics of the Comparative Example 4 electronic device showed it to have resonance characteristics inferior to those of the Example 7 electronic device, namely, an effective electromechanical coupling factor $(fa^2-fr^2)/fr^2$ of 5.0% and a resonance•antiresonance impedance ratio of 40 dB. A bandpass filter fabricated by connecting the Comparative Example 4 electronic device to a prescribed circuit exhibited poorer electric power resistance and pass characteristics than the bandpass filter using the Example 7 electronic device.

What is claimed is:

1. An electronic device, comprising:
   a substrate;
   a lower conductive film formed on said substrate, said lower conductive film, being a metallic film oriented in a (111) plane of a face-centered cubic structure or a (0001) plane of a hexagonal close-packed structure; and
   a functional film formed on said lower conductive film, said functional film being made of a piezoelectric material having a wurtzite crystal structure,
   wherein adhesion of said lower conductive film on a side of said substrate is greater than or equal to 0.1 N/cm.

2. The electronic device as claimed in claim 1, further comprising an adhesion orientation control film provided between said substrate and said lower conductive film.

3. Then electronic device as claimed in claim 2, wherein said adhesion orientation control film is made of a crystal having a wurtzite structure.

4. The electronic device as claimed in claim 3, wherein said adhesion orientation control film is a (0001)-oriented film whose (0001) plane is oriented parallel to a surface of said substrate.

5. The electronic device as claimed in claim 2, wherein said adhesion orientation control film is made of AlN.

6. The electronic device as claimed in claim 1, wherein a X-ray rocking curve FWHM of said lower conductive film and functional film are less than or equal to 5 degrees.

7. The electronic device as claimed in claim 1, further comprising an upper conductive film provided on said functional film, thereby configuring a film bulk acoustic wave resonator composed of said lower conductive film, functional film and upper conductive film.

8. The electronic device as claimed in claim 7, wherein said substrate includes an acoustic multilayer at its surface.

9. An electronic device, comprising:
a substrate;
a lower conductive film formed on said substrate, said lower conductive film being a metallic film oriented in a (111) plane of a face-centered cubic structure or a (0001) plane of a hexagonal close-packed structure; and
a functional film formed on said lower conductive film, said functional film is made of a piezoelectric material having a wurtzite crystal structure,
wherein adhesion of said lower conductive film an a side of said substrate is greater than or equal to 1 N/cm.

10. The electronic device as claimed in claim 9, wherein a X-ray rocking curve FWHM of said lower conductive film and functional film are less than or equal to 5 degrees.

11. The electronic device as claimed in claim 9, further comprising an upper conductive film provided on said functional film, thereby configuring a film bulk acoustic wave resonator composed of said lower conductive film, functional film and upper conductive film.

12. The electronic device as claimed in claim 11, wherein said substrate includes an acoustic multilayer at its surface.

13. An electronic device, comprising:
a substrate;
a lower conductive film formed on said substrate;
an adhesion orientation control film provided between said substrate and said lower conductive film, said adhesion orientation control film being made of a crystal having a wurtzite structure, and
a functional film formed on said lower conductive film,
wherein adhesion of said lower conductive film on a side of said substrate is greater than or equal to 0.1 N/cm.

14. The electronic device as claimed in claim 13, wherein said adhesion orientation control film is made of AlN.

15. An electronic device, comprising:
a substrate;
a lower conductive film formed on said substrate; and
a functional film formed on said lower conductive film, an X-ray rocking curve FWHM of said lower conductive film and functional film being less than or equal to 5 degrees,
wherein adhesion of said lower conductive film on a side of said substrate is greater than or equal to 0.1 N/cm.

16. The electronic device as claimed in claim 15, wherein said X-ray rocking curve FWHM of said lower conductive film and functional film are less than or equal to 3 degrees.

17. The electronic device as claimed in claim 15, further comprising an upper conductive film provided on said functional film, thereby configuring a film bulk acoustic wave resonator composed of said lower conductive film, functional film and upper conductive film.

18. The electronic device as claimed in claim 17, wherein said substrate includes an acoustic multilayer at its surface.

19. An electronic device, comprising:
a substrate;
a lower conductive film formed on said substrate;
a functional film formed on said lower conductive film, and
an upper conductive film provided on said functional film, thereby configuring a film bulk acoustic wave resonator composed of said lower conductive film, functional film and upper conductive film,
wherein adhesion of said lower conductive film on a side of said substrate is greater than or equal to 0.1 N/cm.

20. The electronic device as claimed in claim 19, wherein said substrate includes an acoustic multilayer at its surface.

* * * * *

UNITED STATES PATENT AND TRADEMARK OFFICE
CERTIFICATE OF CORRECTION

PATENT NO. : 7,042,090 B2  
APPLICATION NO. : 10/786776  
DATED : May 9, 2006  
INVENTOR(S) : Takao Noguchi et al.

It is certified that error appears in the above-identified patent and that said Letters Patent is hereby corrected as shown below:

Column 18, line 56, replace "film," with -- film --.

Column 19, line 30, replace "an" with -- on --.

Signed and Sealed this

Fifth Day of September, 2006

JON W. DUDAS  
*Director of the United States Patent and Trademark Office*